United States Patent [19]
Wu

[11] Patent Number: 5,910,221
[45] Date of Patent: Jun. 8, 1999

[54] BONDED SILICON CARBIDE PARTS IN A PLASMA REACTOR

[75] Inventor: Robert W. Wu, Pleasanton, Calif.

[73] Assignee: Applied Materials, Inc., Santa Clara, Calif.

[21] Appl. No.: 08/878,223

[22] Filed: Jun. 18, 1997

[51] Int. Cl.$^6$ ................................................. C23C 16/00
[52] U.S. Cl. ................ 118/723 R; 156/345; 315/111.21; 134/1.1; 204/298.02; 204/298.31
[58] Field of Search ........................... 118/723 R, 723 E, 118/723 MW, 723 ME, 723 MR, 723 MA, 723 AN, 723 ER, 723 I, 723 IR; 156/345; 134/1.1; 315/111.21, 111.31, 111.41, 111.51, 111.61, 111.71; 204/298.01, 298.02, 298.31

[56] References Cited

U.S. PATENT DOCUMENTS

| | | | |
|---|---|---|---|
| 4,999,228 | 3/1991 | Matsumoto et al. | 428/34.4 |
| 5,578,129 | 11/1996 | Moriya | 118/719 |
| 5,653,808 | 8/1997 | MacLeish et al. | 118/715 |

OTHER PUBLICATIONS

Hirai et al., "Silicon carbide prepared by chemical vapor deposition," *Silicon Carbide Ceramics—1: Fundamental and Solid Reaction*, eds. Somiya et al., (Elsevier, 1991), pp. 77–98.

Yamada et al., "Properties and applications of silicon carbide ceramics," *Silicon Carbide Ceramics—1: Fundamental and Solid Reaction, ibid.*, p. 18.

Iseki, "Joining of SiC ceramics," *Silicon Carbide Ceramics—1: Fundamental and Solid Reaction, ibid.*, pp. 239–263.

*Primary Examiner*—Bruce Breneman
*Assistant Examiner*—Luz Alejandro
*Attorney, Agent, or Firm*—Charles Guenzer

[57] ABSTRACT

A plasma reactor, for example, for processing a semiconductor wafer, in which parts of the chamber are formed of multiple pieces of silicon carbide that have been bonded together. The bonding may be performed by diffusion bonding or by using a bonding agent such as polyimide. These silicon carbide parts typically face and define a plasma region. Preferably, the surface facing the plasma is coated with a silicon carbide film, such as that deposited by chemical vapor deposition, which is more resistant to erosion by the plasma. Advantageously, the different parts are formed with different electrical resistivities consistent with forming an advantageous plasma.

20 Claims, 5 Drawing Sheets

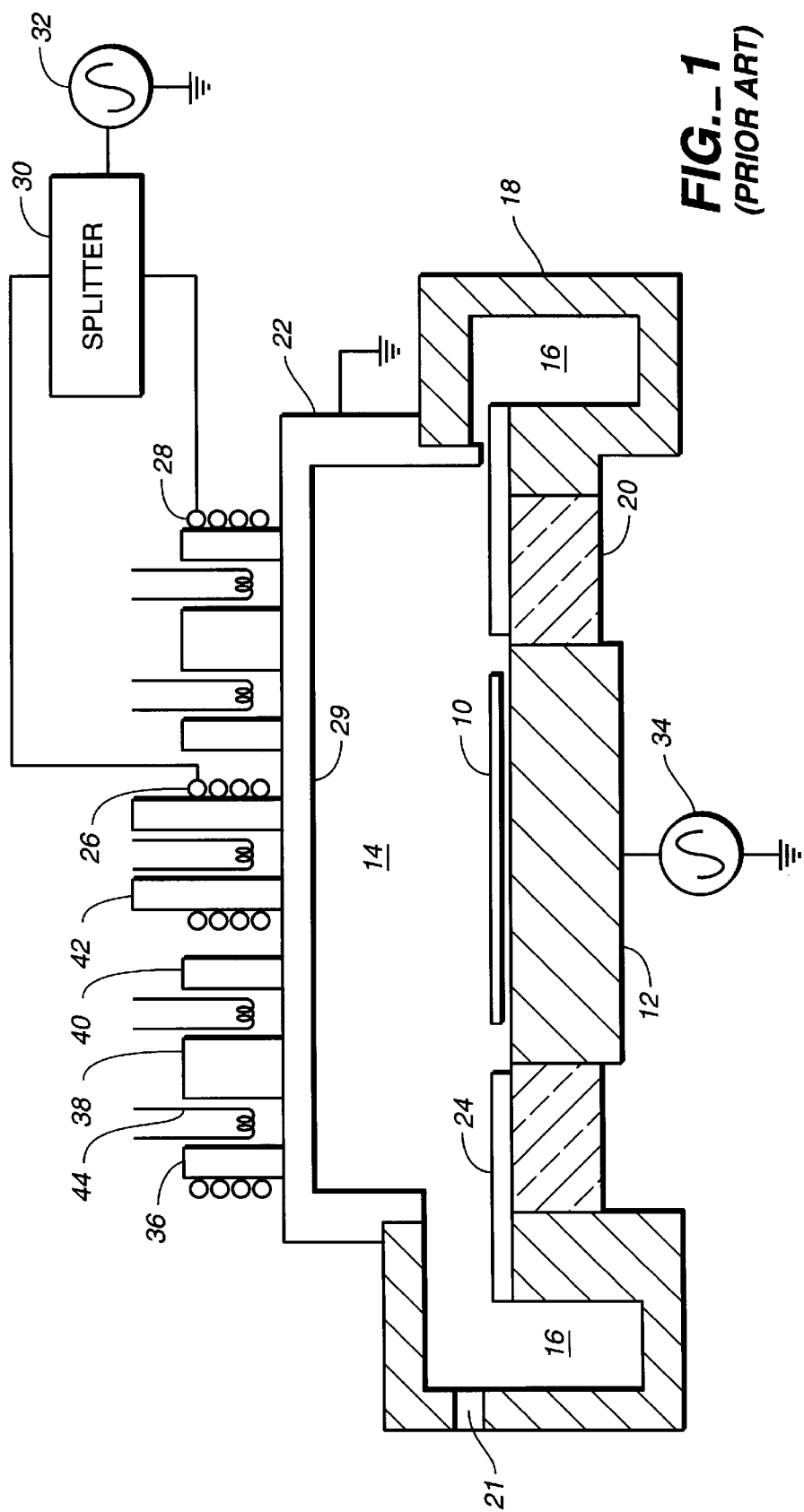
FIG._1
(PRIOR ART)

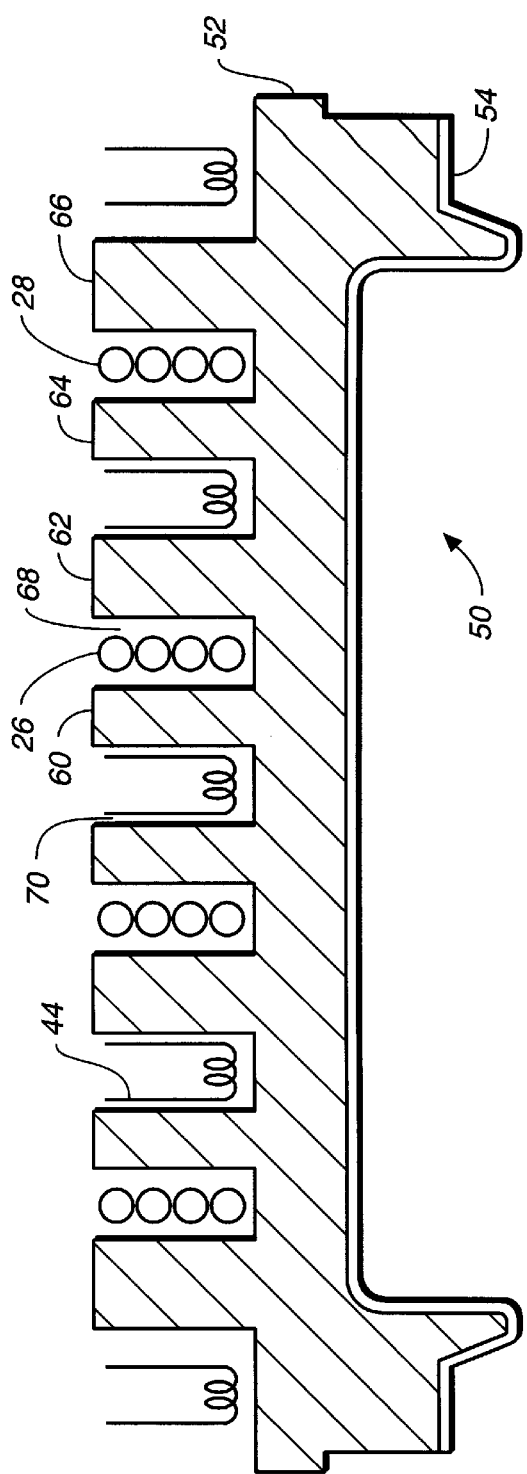
FIG._2
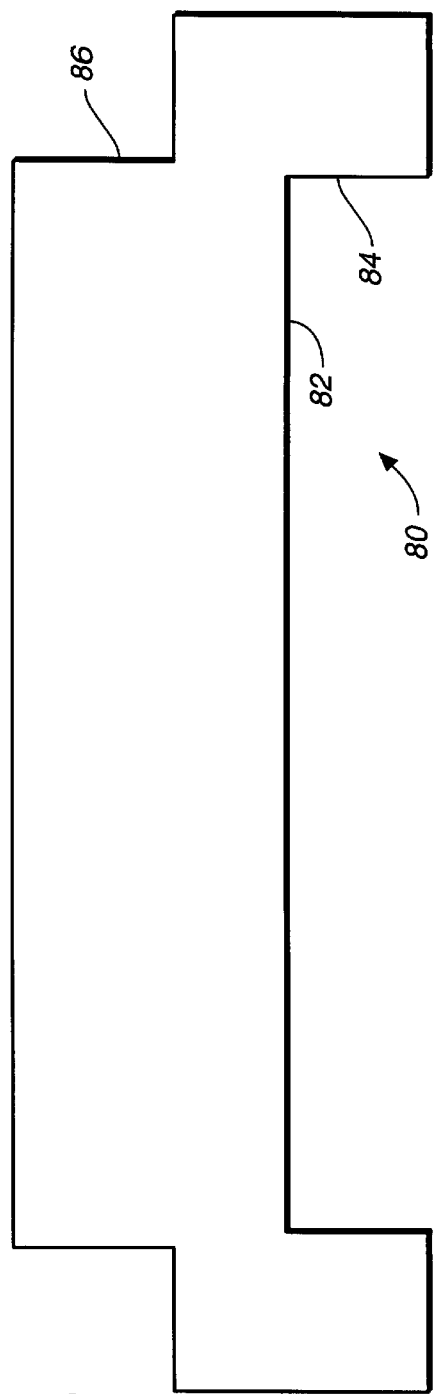
FIG._3

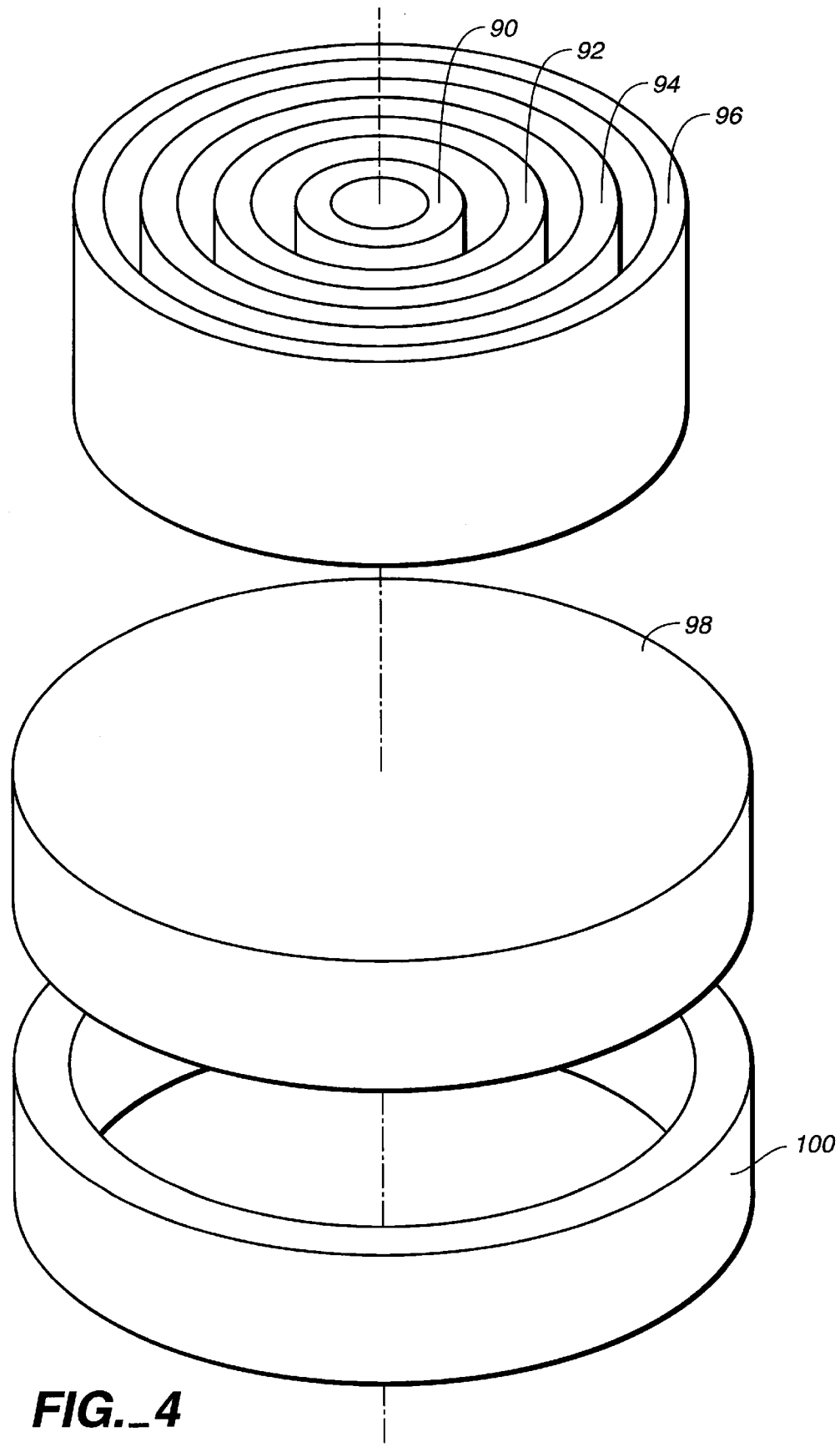
FIG._4

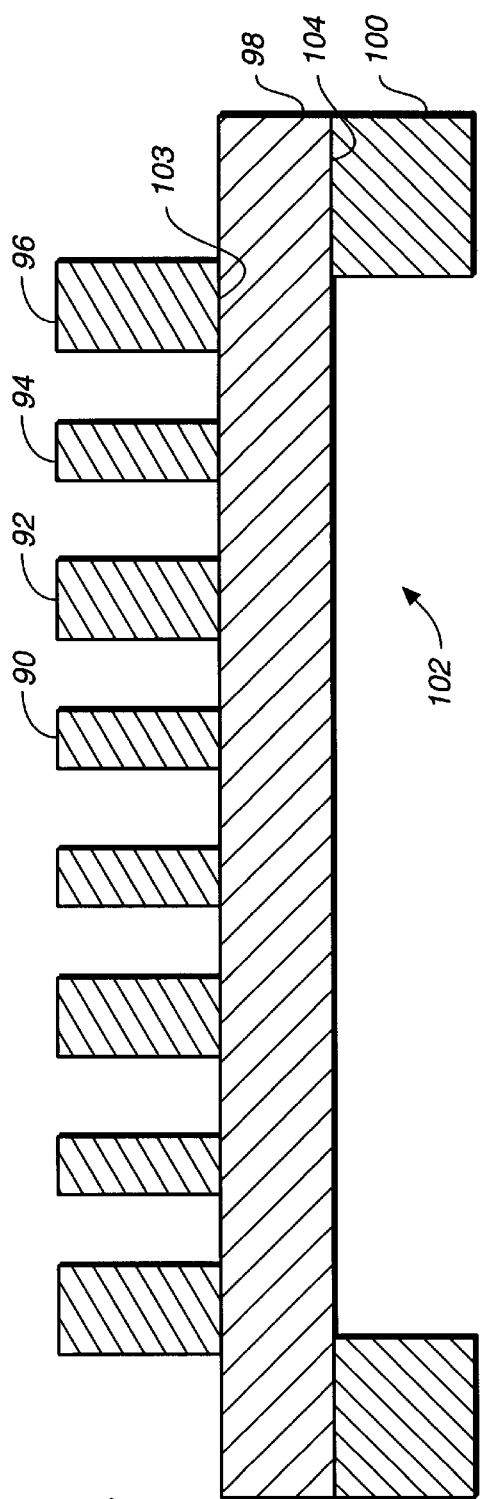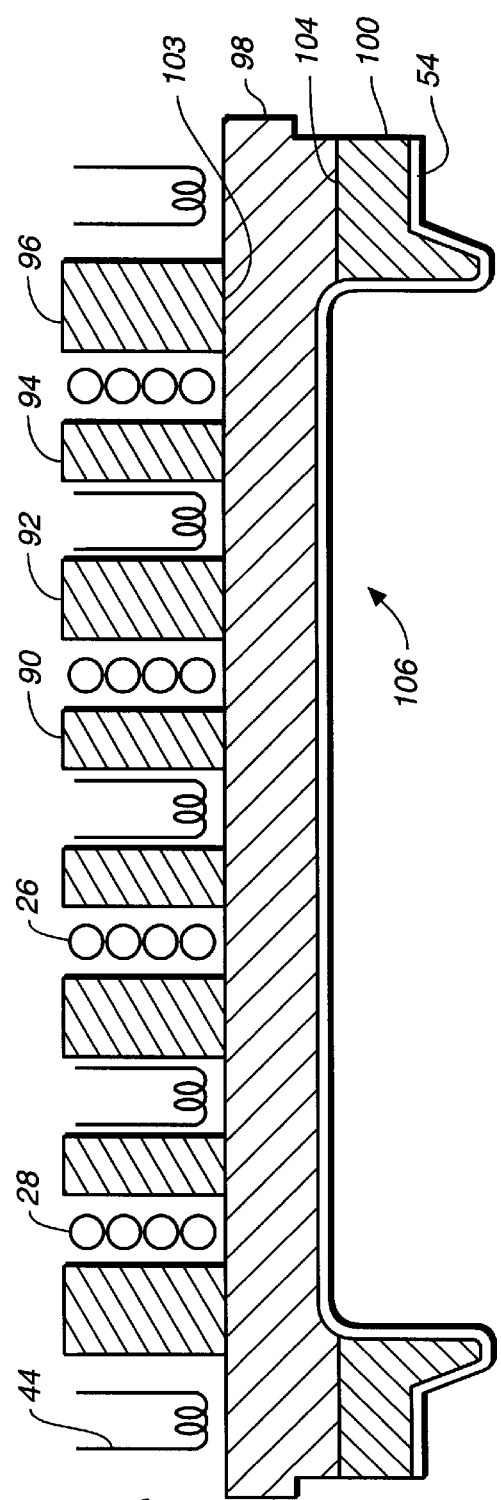

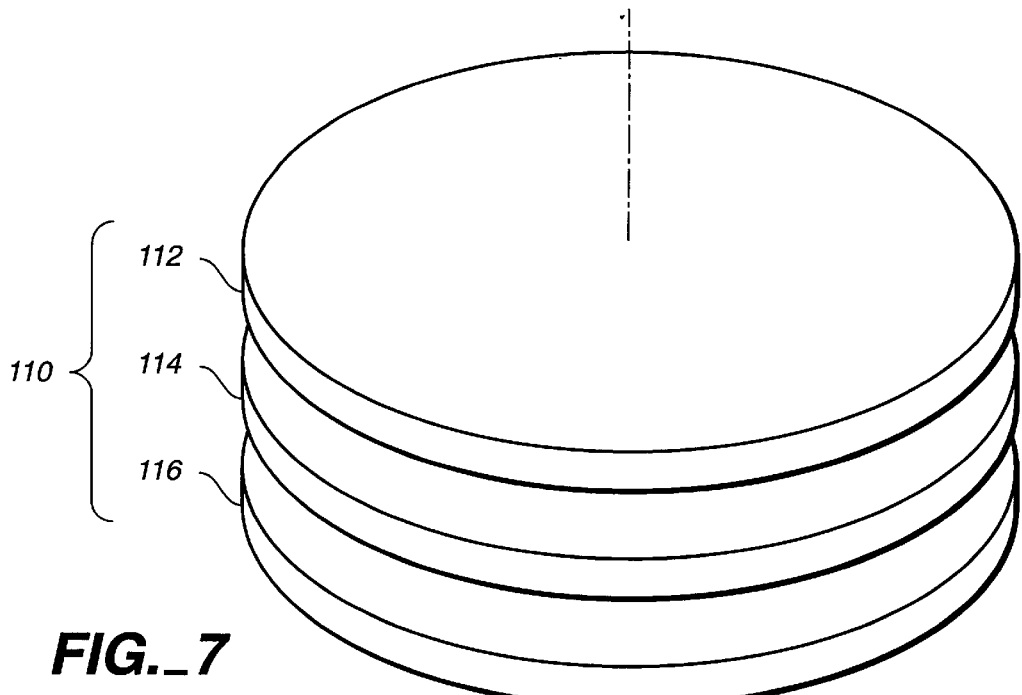
FIG._7
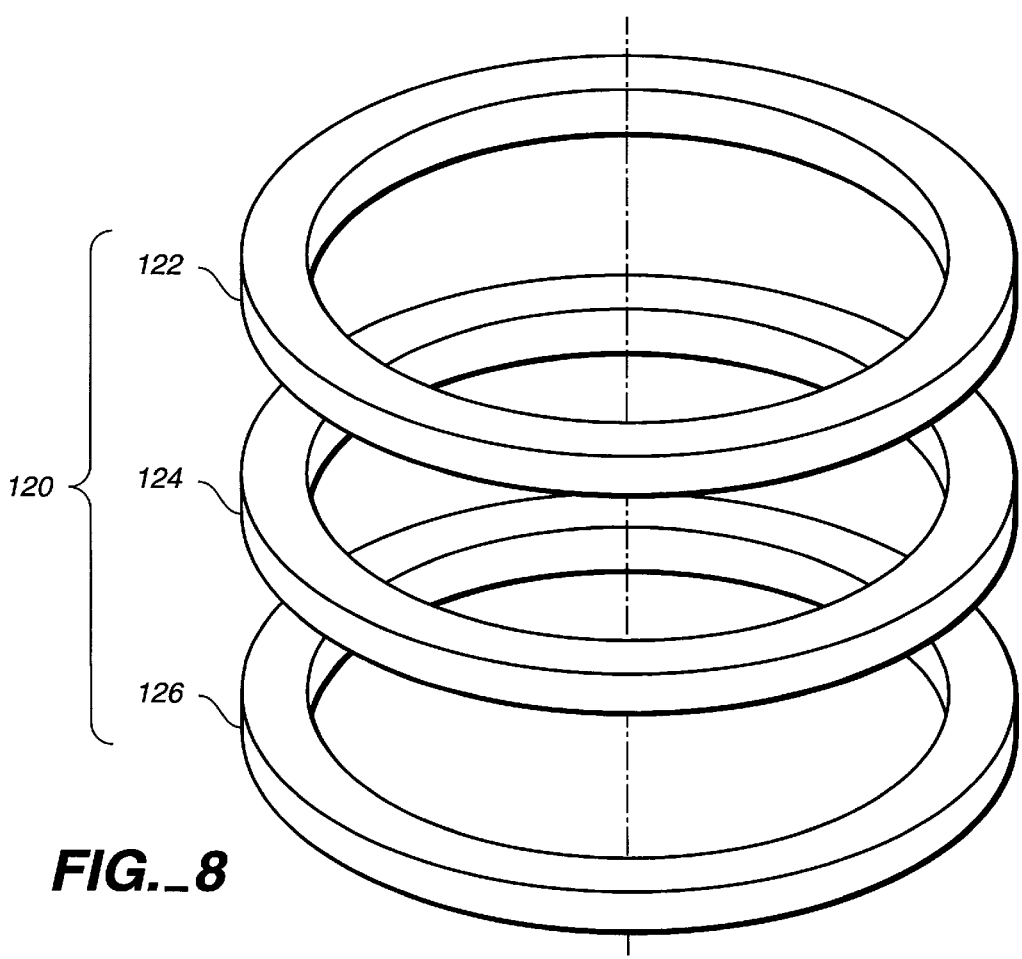
FIG._8

BONDED SILICON CARBIDE PARTS IN A PLASMA REACTOR

FIELD OF THE INVENTION

The invention relates generally to plasma reactors and their operation. In particular, the invention relates to the plasma etching of semiconductors, and more particularly to oxide etching.

BACKGROUND ART

Many of the critical steps in the fabrication of advanced semiconductor integrated circuits involve processing in a plasma reactor. These steps include etching, chemical vapor deposition (CVD), and physical vapor deposition (PVD). In all these processes, a processing gas flows into the processing chamber, and an electric field excites the gas into a plasma. Particularly in etching and to a lesser extent in CVD, the excited processing gas is very reactive (which is why it is excited into a plasma) and reacts not only with the wafer but also with chamber parts that are exposed to the plasma. As a result, many of the parts in a plasma reactor facing the plasma have presented materials problems. If the plasma significantly reacts with the chamber part, a number of problems may occur. The processing chemistry involving the wafer may be disturbed by the side reactions with the material of the chamber. Some ceramics, such as quartz, are preferentially etched along grain boundaries, and the preferential etching of the inter-granular portions liberates grains from the ceramics. As a result, extraneous particles are formed which settle on the wafer and may drastically reduce the yield of operable chips. Long-term exposure of the chamber part to the plasma may erode the part to such an extent that it fails in its mechanical or electrical function.

A newer generation of plasma reactors is being developed and commercialized which can be characterized as high-density plasma (HDP) reactors. By various means, the ion density of the plasma is increased to levels significantly above prior generations of commercial plasma reactors. The higher density of plasma not only accelerates the processing, but in several applications is required for effectively processing the increasingly smaller features of semiconductor integrated circuits. However, the high-density plasmas have increased the severity of the problems associated with the chamber parts, and prior materials solutions have been shown to be insufficient.

Furthermore, the mechanisms for creating the high-density plasma often require a complexity of chamber design not previously required in commercial semiconductor fabrication equipment.

An example of an advanced plasma etching reactor, particularly useful for oxide etching, is illustrated in the cross-sectional view of FIG. 1. This reactor is simplified from one disclosed by Collins et al. in U.S. Pat. application, Ser. No. 08/648,254, filed May 13, 1996. A wafer 10 is supported on a pedestal 12 facing a processing space 14 within a vacuum chamber. An annular pumping channel 16 formed in a chamber base 18 is pumped by an unillustrated vacuum system. An insulating ring 20 electrically isolates the pedestal 12 from the chamber base 18. A slit valve opening 21 in the chamber base 18 and an associated but unillustrated slit valve allow the wafer 10 to be transferred into and out of the vacuum chamber. The top of the vacuum chamber is formed by a dome 22 composed of silicon, and a silicon ring 24 surrounds the wafer 10. One or more unillustrated gas ports supply, for oxide etching, a fluorine-based etching gas.

The etching gas is excited into a high-density plasma primarily by RF power inductively coupled into the chamber through two concentric helical coils 26, 28 extending above a flat roof 29 of the dome 22. An RF power splitter 30 splits RF power from a source RF power supply 32, for example operating at 2 MHz, between the two coils 26, 28 so as to tailor the RF magnetic field induced within the plasma inside the chamber. A bias RF power supply 34 connected to the pedestal 12 provides a controllable DC self-bias in the plasma sheath adjacent to the wafer 10 for controlling the etching kinetics. The silicon dome 22 is electrically grounded to provide a grounding plane for the chamber.

A number, four in the illustration, of rings 36, 38, 40, 42 composed of a ceramic that is preferably thermally conductive but electrically highly resistive are located on top of the dome roof 29. The two coils 26, 28 are wrapped around two rings 42, 36. A number of radiant lamps 44 are placed in remaining annular channels formed between the rings 36, 38, 40, 42 and control the temperature of the silicon dome 22. Unillustrated radiant heating means also control the temperature of the silicon ring 24 around the wafer 10.

When the chamber is being used to etch a layer of silicon dioxide in the wafer 10 and the etching process must be highly selective against etching underlying silicon or polysilicon, the preferred etching gas is a fluorocarbon, such as $CF_4$, and the silicon dome 22 and ring 24 are used to scavenge fluorine from the plasma of the etching gas, that is, to remove fluorine, leaving a carbon-rich plasma. As a result, a polymer having a low fluorine content forms on non-oxygen parts of the wafer 10, specifically silicon or silicon nitride parts once the silicon dioxide covering them has been etched away. The low-fluorine polymer protects the non-oxygen parts from etching, thus producing a high etch selectivity. The radiant lamps 44 and other temperature control elements control the temperature of the scavenging dome 22 and ring 24 since the scavenging process is sensitive to temperature.

One of the difficulties with the silicon dome 22 of FIG. 1 is the requirement that it both act as a grounding plane and also pass an RF magnetic field from the coils 26, 28 into the chamber. A good grounding plane requires a high electrical conductivity while an RF wall should have a low electrical conductivity. These conflicting requirements are addressed by striking a balance between the bulk electrical conductivity and the RF skin depth relative to the thickness of the window. Typical resistivities for bulk pieces providing sufficient mechanical strength for a vacuum chamber are in the range of 30 to 200Ω-cm. Although acceptable results have been achieved, it is desired to better address both requirements. Other difficulties with the silicon dome 22 are that large pieces of silicon of high electrical resistivity are expensive and that it is difficult to control the reproducibility of the ingots from which the pieces are formed. Furthermore, large silicon pieces are prone to chipping and cracking.

Lu et al. in U.S. Pat. application, Ser. No. 08/687,740, filed Jul. 26, 1996, incorporated herein by reference, disclose a dome of a robust, cost-effective material which independently addresses the requirements of the grounding plane and of the RF window. As illustrated for a crown dome 50 in the cross-sectional view of FIG. 2, the dome 50 includes a base part 52 of sintered, preferably hot pressed, silicon carbide and a thin film 54 of silicon carbide extending on the side of the base part 52 exposed to the plasma within the chamber. As Lu et al. explain, the silicon carbide is preferably stoichiometric or nearly so, but its composition may extend through the range of 40 to 60 atomic % of both silicon and carbon. The SiC thin film 54 is preferably formed by chemical vapor deposition (CVD) although other deposition and formation techniques are possible, as is explained by Lu et al. Hirai et al. review CVD formation of silicon carbide in "Silicon carbide prepared by chemical vapor deposition," Silicon Carbide Ceramics - 1: Fundamental and Solid Reaction, eds. Somiya et al., (Elsevier, 1991), pp. 77–98. However, the SiC film may be formed by other well known processes. Silicon carbide is also known to operate as a fluorine scavenger. The base body part 52 includes a number of circular rings 60, 62, 64, 66 providing annular channels 68 as well as one central hole 70 for the two coils 26, 28 and the radiant heaters 44.

A principal advantage of the composite structure is that the bulk, SiC base part 52 can be made fairly resistive so as to not ground out the RF electromagnetic field which the inductive coils couple from one side of the roof to the other. At the same time, the SiC thin film 54 can be made of low-resistivity material that allows effective low-frequency biasing of the thin film 54 by an unillustrated electrical connection and hence of the entire roof. Although such a low resistivity in a bulk part would ground out the electromagnetic field, the thin film 54 may be made thin enough that its thickness is comparable to or less than the RF skin depth, thus not grounding out the electromagnetic field. Examples of thicknesses and resistivities of the roof of the sintered base 52 and of the film 54 are tabulated in TABLE 1.

TABLE 1

| PART | RESISTIVITY (Ω-cm) | RF COUPLING EFFICIENCY |
|---|---|---|
| Base (18–23 mm) | >$10^5$ | Low RF Loss |
| CVD (4 mm) | 20–40 | Better than Si |

The highly resistive base produces negligible RF loss while the moderately conductive but thin CVD film provides 20 to 25% higher RF coupling efficiency than a comparable silicon roof Further advantages of the composite structure are that silicon carbide is a reasonably good thermal conductor and that the two SiC elements 52, 54 have virtually the same coefficients of thermal expansion, as tabulated in TABLE 2 for a number of temperatures

TABLE 2

| Temperature | Coefficient of Thermal Expansion ($10^{-6}/°$ C.) | |
|---|---|---|
| (° C.) | Base | CVD Film |
| 100 | 3.5 | 3.7 |
| 200 | 4.0 | 4.0 |
| 300 | 4.2 | 4.3 |

The closeness of thermal expansion between the sintered base and the CVD film reduces thermal shock. Also, a silicon carbide CVD film 54, which is the only silicon carbide exposed to the processing space, is a very clean material, producing few particles, even in the corrosive fluorine plasma environment of oxide etching. On the other hand, bulk sintered silicon carbide is relatively inexpensive and can be made in even larger sizes for future 300 mm-wafer applications. Finally, sintered silicon carbide exhibits good mechanical characteristics.

Nonetheless, the composite crown dome 50 of FIG. 2 has some disadvantages. The crown dome 50 is relatively large, about 40 cm in diameter and 12 cm in height, and is complexly shaped. Such shapes of silicon carbide can be preformed into near net shape (NNS) by hot pressing, a form of sintering. An example of a NNS base 80 is illustrated in cross section in FIG. 3. In this case, the NNS base 80 is integrally formed with a base plate 82, a base ring 84, and an undefined base roof 86 to be formed later into the rings for the inductive coils and radiant lamps. After the NNS base 80 is formed by sintering, it is machined into final shape, and thereafter the CVD film 54 is deposited to form the crown dome 50 of FIG. 2. The NNS part may assume a more or less complex shape depending on the tradeoff between the amount of machining and the length of the sintering time and cool down required for complex sintered parts. Sintering is a high-temperature and/or high-pressure process, and the size and shape of the crown dome requires a long sintering process including cool down. Furthermore, a single defect at any point in the sintering can ruin an entire dome, thus presenting a large financial risk.

Another problem arises from the fact that the film thickness, of the order of a few millimeters, still must balance grounding resistance and RF skin depth. As a result, the grounding resistance is designed to be only barely adequate. However, during long term processing, the CVD thin film 54 is partially eroded, thus increasing the grounding resistance. Any such variation in grounding resistance introduces a process variation that is best avoided in a reactor intended for continuous production.

SUMMARY OF THE INVENTION

The invention may be summarized as a silicon carbide body, particularly useful as a wall or other part for a plasma reactor. The body is formed by bonding together multiple sub-parts of sintered or hot pressed silicon carbide.

Advantageously for plasma processing, the multiple sintered parts may have differing electrical resistivities. The differing resistivities are usefully applied to chamber walls facing the plasma. For example, the part nearer the plasma can be of low electrical resistance and used as an electrical grounding plane or other electrode capacitively coupling energy into the plasma while the part further away from the plasma is of high electrical resistance and presents less resistive loss for an electromagnetic field coupling energy into the chamber, such as from an RF inductive coil.

The plasma chamber part can be further enhanced by coating its surface facing the interior of the plasma chamber with a silicon carbide film, such as produced by chemical vapor deposition, thereby reducing particle generation while providing yet an additional electrical biasing plane.

Advantageously, the resistivities of the CVD silicon carbide film and the innermost silicon carbide part have nearly the same resistivities so that erosion of the film during prolonged plasma process does not significantly change the effective lateral resistance.

BRIEF DESCRIPTION OF THE DRAWINGS

FIG. 1 is a cross-sectional view of an inductively coupled plasma reactor.

FIG. 2 is a cross-sectional view of a silicon carbide dome used in the plasma reactor of FIG. 1.

FIG. 3 is a cross-sectional view of one embodiment of a near net shape sintered body used to form the integral dome of FIG. 2, as practiced in the prior art.

FIG. 4 is an orthographic view of the silicon carbide parts used to form the composite silicon carbide dome of the invention.

FIG. 5 is a cross-sectional view of the parts of FIG. 4 after being bonded into a composite base.

FIG. 6 is a cross-sectional view of a composite crown dome formed from the composite base of FIG. 5 and including a silicon carbide film.

FIG. 7 is an orthographic view of the sub-parts to be joined together to form a composite base plate.

FIG. 8 is an orthographic view of the sub-parts to be joined together to form a composite base ring.

DETAILED DESCRIPTION OF THE PREFERRED EMBODIMENTS

The invention includes silicon carbide members advantageously used as walls in plasma reactors. One such part is formed by bonding together multiple sintered silicon carbide parts. Of particular advantage for plasma processing is the additional feature that the different parts may have significantly different electrical resistivities.

A first embodiment of the invention is a composite silicon carbide crown dome. It is formed from multiple hot-pressed cylindrically shaped silicon parts shown in the orthographic view of FIG. 4, specifically four roof rings 90, 92, 94, 96, a base plate 98, and a base ring 100. Although illustrated together, at this stage all the parts are mechanically separate from each other. All the parts are formed of hot pressed silicon carbide. Hot pressing is a form of sintering in which high pressure is applied during the sintering step. See, for example, Yamada et al., "Properties and applications of silicon carbide ceramics," Silicon Carbide Ceramics - 1: Fundamental and Solid Reaction, ibid., p. 18.

In a single additional hot press process, the parts 90 through 100 are diffusion bonded together to form the composite near-net-shape (NSS) base 102 illustrated in cross section in FIG. 5. The parts 90 through 100 have substantially the same composition, with the possible exception of doping elements used to control resistivity, as will be discussed later. However, definable bonding planes 103, 104 exist between the parts. Depending upon the bonding process, the bonding planes 103, 104 may be only diffuse boundaries following diffusion bonding or may represent a bonding agent, for example, an adhesive used in thermoplastic bonding.

Subsequent to bonding into a single larger part, the composite NNS base 102 is machined into its final shape, as illustrated in the cross-sectional view of FIG. 6, and the silicon carbide CVD coating 54 is then deposited, thereby forming a doubly composite crown dome 106. It is doubly composite because not only are there separate sintered and CVD silicon carbide parts, but the sintered silicon carbide body is formed of multiple bonded pieces.

The composite crown dome has the advantage that the parts from which it is formed can be more simply and quickly sintered since the parts are smaller and have more regular shape. The amount of machining of the NNS part can be reduced. Also, for moderately sized parts, multiple pieces can be hot pressed at one time in a large oven, thus reducing furnace time.

A particular advantage of the composite base is that the different silicon carbide bulk pieces may be made to have different resistivities. Examples of the resistivities of the parts in the conventional singly composite crown dome 50 of FIG. 2 and the doubly composite crown dome 106 of FIG. 6 are presented in TABLE 3.

TABLE 3

| PART | RESISTIVITY ($\Omega$-cm) | |
|---|---|---|
| | Singly Composite | Doubly Composite |
| Roof Rings | >$10^5$ | >$10^5$ |
| Base Plate | >$10^5$ | 100–200 |
| Base Ring | >$10^5$ | 100–200 or >$10^5$ |
| CVD | 20–40 | 20–40 |

The roof rings 90, 92, 94, 96 are made highly resistive to as much as possible eliminate RF loss in a portion of the chamber being used primarily for heat sinking. The resistivity of the CVD film 54 is made low to provide low grounding resistance. One approach for achieving controllably low resistivity in a CVD film involves nitrogen doping during deposition. For example, the volumetric flow rate of $N_2$ into the CVD chamber is 3 to 10% of that of the remainder of the CVD precursor gases. The resistivities of the base plate 98 and base ring 100 are chosen as a compromise between not creating excessive RF loss while aiding in the grounding resistance (actually electrical conductance) otherwise performed by the CVD film 54. Thereby, as the CVD film 54 erodes during processing, the grounding resistance does not dramatically increase.

It is possible to further reduce the change of grounding resistance of the part over the lifetime of the crown dome by designing the base plate, base ring, and CVD film to all have the same resistivity, 20 to 40$\Omega$-cm following the general example of TABLE 3. As noted in TABLE 1, the thickness of the base plate 98 is substantially greater than that of the CVD film 54 so that the CVD film 54 could be nearly completely eroded away with no substantial effect on processing. It is still preferred to include the CVD film 54, even though it has the same resistivity as the underlying bulk parts 98, 100, because a CVD film of silicon carbide is much cleaner than sintered silicon carbide and thus reduces the production of particles and the resultant contamination compared to sintered silicon carbide. If the underlying base plate 98 provides adequately low grounding resistance, then the resistivity of the CVD film can be increased somewhat as long as the resistance perpendicular to the plane of the film does not substantially increase the net effective lateral grounding resistance through both the film and the base plate. Films are distinguished from the sintered parts in that they were never free standing bodies prior to being formed on the substrate. Films are either deposited, usually by CVD or by thermal spraying, or are formed by chemical reaction with the underlying substrate.

Other resistivity combinations are possible. In some plasma processing, relatively little RF power is grounded through the base ring 100 but the RF magnetic field can sink much power there. In this situation, it may be preferable to assign a high electrical resistivity to the base ring 100 and rely only upon the CVD film 54 for the grounding current on the inside top of the crown dome. This high resistivity also reduces loss in the circulating RF electrical field.

It is thus seen that the parts may be formed with substantially different resistivities differing by at least a factor of ten, or they may be formed with nearly equal resistivities differing by no more than a factor of four. Even the intermediate range of moderately different resistivities differing by between four and ten is useful when the trade offs are close.

The design of the crown dome can be further improved by forming many of the parts of FIG. 4 from multiple, vertically separate sub-parts. As illustrated in the cross-sectional view of FIG. 7, a composite base plate 110 is formed from multiple disks 112, 114, 116, here illustrated as three but four disks may be preferred. Similarly, as illustrated in FIG. 8, a composite base ring 120 is formed from multiple tubular annuli 122, 124, 126. The disks and annuli all are formed of hot-pressed silicon carbide. Although not illustrated, the roof rings may be similarly vertically segmented. All the parts in the crown dome may be bonded together in a single operation, or the sub-parts having a similar shape may be first bonded into a larger part, which is thereafter bonded into the dome.

The vertical segmentation offers several advantages. The sub-parts which are formed by sintering are substantially thinner than the parts which they thereafter form. The smaller sub-parts can be much more quickly sintered and cooled down since the mulitiplicity of parts is not an overriding concern for relatively small parts being fabricated in large ovens. Again, a defect in one sub-part does not affect any other sub-parts. Further, the electrical resistivities may be varied between the sub-parts. For example, the lowest disk 116 of the base plate 110 may have a relatively low resistivity close to that of the CVD film to reduce the grounding resistance while the upper two disks 112, 114 have very high resistivity to reduce the inductively coupled RF loss.

Pieces of sintered silicon carbide can be joined by a number of methods, as is discussed by Iseki in "Joining of SiC ceramics," Silicon Carbide Ceramics - 1: Fundamental and Solid Reaction, ibid., pp. 239–263. The two methods tried with the invention are diffusion bonding and polyimide adhesive. For diffusion bonding, the already hot pressed silicon carbide pieces are preferably bonded together by another hot pressing in which two or more pieces are bonded together in a hot, isostatic press process. This diffusion bonding process is very similar to hot pressing used for sintering except the time, pressure, and temperature may be different to avoid possible grain growth of the SiC. Undesirable grain growth changes the material characteristics of the silicon carbide.

Although the invention is particularly advantageous to oxide etching of semiconductor integrated circuits in a plasma reactor, it may be applied to other forms of etching and even of CVD. Indeed, the invention is also advantageous to plasma reactors for processing other types of workpieces.

What is claimed is:

1. A plasma processing chamber, comprising:
   a vacuum chamber;
   a support for a workpiece to be processed within said vacuum chamber, said processing chamber being adapted to receive electrical energy to excite a processing gas within said vacuum chamber into a plasma; and
   a larger part disposed at least partially within a portion of said vacuum chamber, therefore exposed to said plasma, and comprising a first sintered silicon carbide part bonded to a second sintered silicon carbide part, wherein said first and second parts are initially mechanically separate before being bonded together.

2. The chamber of claim 1, wherein said larger part further comprises a silicon carbide film formed over said second sintered part and said silicon carbide film facing said plasma within said chamber.

3. The chamber of claim 2, wherein said first and second sintered parts have respective and different first and second electrical resistivities.

4. The chamber of claim 3, wherein said first resistivity is greater than said second resistivity.

5. The chamber of claim 4, further comprising an inductively coupled coil disposed outside of at least said second sintered part.

6. The chamber of claim 3, wherein said first and second electrical resistivities differ by at least a factor of ten.

7. The chamber of claim 2, wherein said silicon carbide film has a third electrical resistivity greater than said first electrical resistivity.

8. The chamber of claim 7, wherein said third resistivity is greater than said first resistivity by at least a factor of ten.

9. A plasma processing chamber, comprising:
   a vacuum chamber;
   a support for a workpiece to be processed with said vacuum chamber, said processing chamber being adapted to receive electrical energy to excite a processing gas within said vacuum chamber into a plasma; and
   a larger part disposed at least partially within said chamber, wherein said layer part comprises a first sintered silicon carbide part bonded to a second sintered silicon carbide part, and a silicon carbide film is formed over said second sintered part and is facing said plasma with said vacuum chamber;
   wherein said first part has a first electrical resistivity, said second part has a second electrical resistivity less than said second resistivity, and
   said silicon carbide film has a third electrical resistivity greater than said first electrical resistivity; and
   wherein said silicon carbide film is connected to an electrical potential.

10. A plasma processing system, comprising:
    a vacuum chamber;
    a support for a workpiece to be processed within said chamber, said processing system being configured to receive electric energy to excite a processing gas within said vacuum chamber into a plasma; and
    a larger part disposed at least partially within said vacuum chamber and comprising
       a first sintered silicon carbide part,
       a second sintered silicon carbide part bonded to said first silicon carbide part, and
       a silicon carbide film formed over said second sintered part and facing said plasma within said vacuum chamber.

11. The processing system of claim 10, wherein said first and second sintered parts have respective and different first and second electrical resistivities.

12. The processing system of claim 11, wherein said first resistivity is greater than said second resistivity.

13. The processing system of claim 12, were said first resistivity is greater than said second resistivity by at least a factor of ten.

14. The processing system of claim 11, wherein said silicon carbide film has a third electrical resistivity greater than said first electrical resistivity.

15. The processing system of claim 14, wherein said third resistivity is greater than said first resistivity by at least a factor of ten.

16. A plasma processing system, comprising:
    a vacuum chamber;
    a support for a workpiece to be processed within said chamber, said system being adapted to receive electrical energy to excite a processing gas within said chamber into a plasma; and
    a larger part disposed at least partially within a portion of said vacuum chamber and comprising
       a first sintered silicon carbide part having a first electrical resistivity, and a second sintered silicon carbide part bonded to said first silicon carbide part and having a second electrical resistivity different than said first electrical resistivity.

17. The system of claim 16, wherein said first and second electrical resistivities are different by at least a factor of ten.

18. The system of claim 17, wherein said first electrical resistivity is greater than said second resistivity.

19. The system of claim 17, further comprising a silicon carbide film having a third electrical resistivity and formed over said second sintered part.

20. The system of claim 19, wherein said third electrical resistivity is greater than said first electrical resistivity by at least a factor of ten.

* * * * *